United States Patent
Kinoshita et al.

(10) Patent No.: US 7,009,401 B2
(45) Date of Patent: Mar. 7, 2006

(54) BATTERY APPARATUS AND METHOD FOR MONITORING BATTERY STATE OF A SECONDARY BATTERY

(75) Inventors: Takuya Kinoshita, Hitachi (JP); Hideki Miyazaki, Hitachi (JP); Akihiko Emori, Hitachi (JP); Tokiyoshi Hirasawa, Ogawa (JP)

(73) Assignees: Hitachi, Ltd., Tokyo (JP); Shin-Kobe Electric Machinery Co., Ltd., Tokyo (JP)

( * ) Notice: Subject to any disclaimer, the term of this patent is extended or adjusted under 35 U.S.C. 154(b) by 0 days.

(21) Appl. No.: 10/636,672

(22) Filed: Aug. 8, 2003

(65) Prior Publication Data

US 2004/0076872 A1    Apr. 22, 2004

(30) Foreign Application Priority Data

Oct. 21, 2002    (JP) .............................. 2002-305873

(51) Int. Cl.
*G01N 27/416*    (2006.01)
(52) U.S. Cl. ...................... 324/430; 324/426; 324/427; 324/429
(58) Field of Classification Search ........ 324/426–427, 324/429–431; 180/65.1
See application file for complete search history.

(56) References Cited

U.S. PATENT DOCUMENTS 4,678,998 A * 7/1987 Muramatsu ................. 324/427
5,343,970 A * 9/1994 Severinsky ................. 180/65.2
5,457,377 A  10/1995 Jonsson

FOREIGN PATENT DOCUMENTS

| DE | 43 33 520 | 4/1994 |
| DE | 199 36 542 | 3/2001 |
| WO | WO 01/09631 | 2/2001 |

* cited by examiner

*Primary Examiner*—Michael Sherry
*Assistant Examiner*—Robert Grant
(74) *Attorney, Agent, or Firm*—Antonelli, Terry, Stout and Kraus, LLP.

(57) ABSTRACT

Motor generator (MG) is controlled via motor controller by MG control processor of CPU, so that voltage and current of battery is detected while changing frequency of state detection current flowing in the secondary battery. According to the detection results, impedance is calculated in the impedance calculation unit. Remaining mount is calculated from the impedance obtained and the battery characteristics stored in memory. Furthermore, remaining amount change correction unit adds integration current between impedance measurements to the remaining amount for correcting the remaining amount. Weighting coefficient is determined from the standard deviation based on the corrected value and the remaining amount and weighted mean is calculated in weighted mean unit. Next, the result of the remaining amount calculation is used to perform service life calculation and service life correction calculation, and weighted mean is calculated in the same way as the remaining amount.

15 Claims, 13 Drawing Sheets

FIG. 12

| | | |
|---|---|---|
| ① AT VEHICLE START (DURING ENGINE STOP) | ENGINE ⇧ TIRES ⇐ MG ⇐ BATTERY ⇒ Load | STATE DETECTION DISABLED |
| ② AT VEHICLE START (DURING ENGINE OPERATION) | ↘ ENGINE ⇩ TIRES MG ⇒ BATTERY ⇒ Load | STATE DETECTION ENABLED |
| ③ DURING ACCELERATION ASSIST | ↘ ENGINE TIRES ⇐ MG ⇐ BATTERY ⇒ Load | STATE DETECTION DISABLED |
| ④ DURING ACCELERATION/ RUNNING | ↘ ENGINE ⇩ TIRES MG ⇒ BATTERY ⇒ Load | STATE DETECTION ENABLED |
| ⑤ DURING SPEED REDUCTION | ENGINE TIRES ⇒ MG ⇒ BATTERY ⇒ Load | (STATE DETECTION ENABLED) |
| ⑥ AT VEHICLE STOP (DURING ENGINE STOP) | ENGINE TIRES MG BATTERY ⇒ Load | STATE DETECTION ENABLED |
| ⑦ AT VEHICLE STOP (DURING ENGINE OPERATION) | ENGINE ⇩ TIRES MG ⇒ BATTERY ⇒ Load | STATE DETECTION ENABLED |

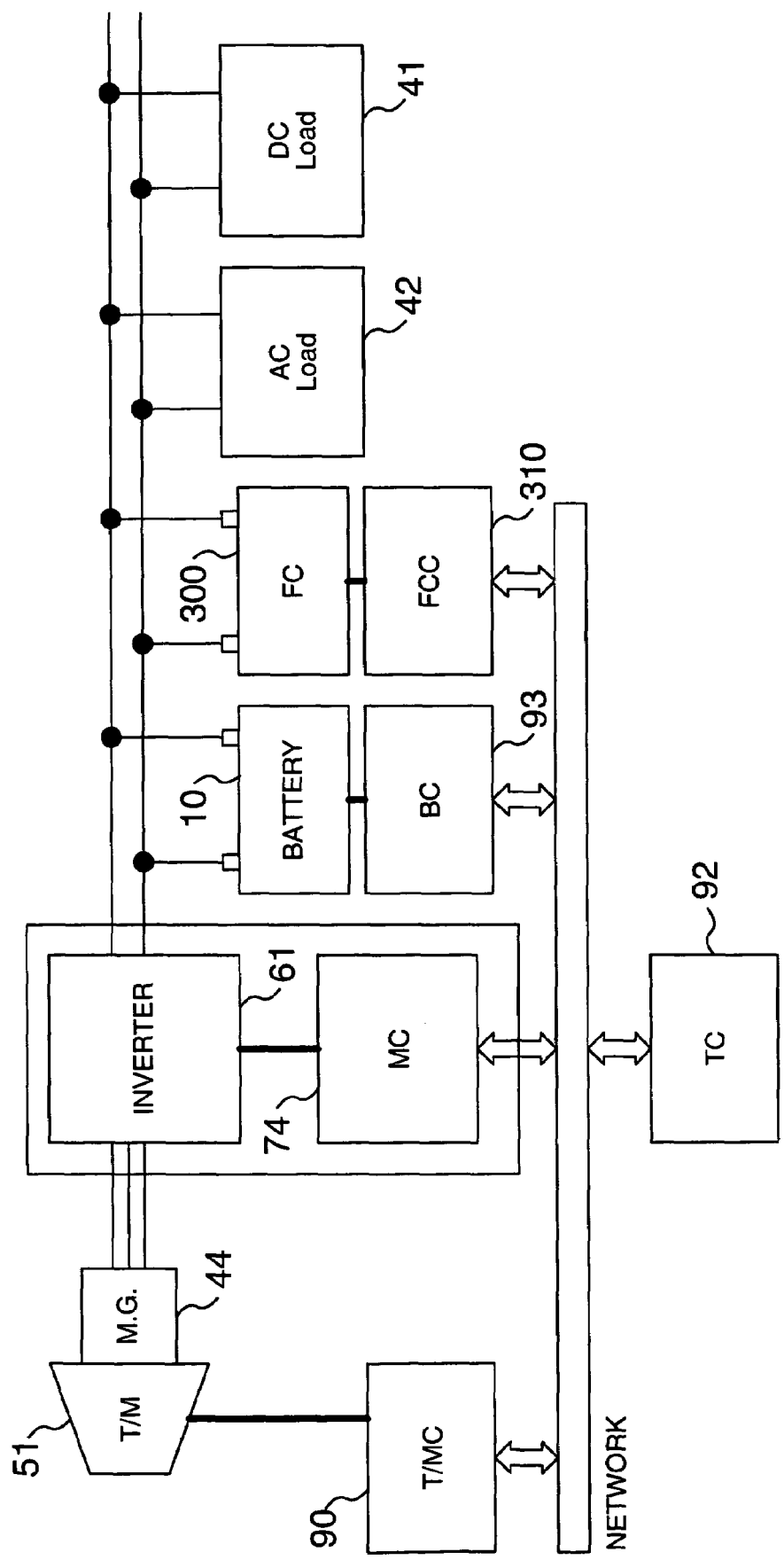

FIG. 19

| | | |
|---|---|---|
| ① AT VEHICLE START, LARGE REMAINING AMOUNT | 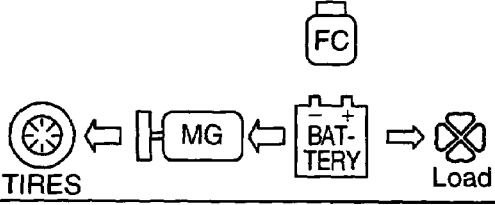 | STATE DETECTION DISABLED |
| ② AT VEHICLE START, SMALL REMAINING AMOUNT | 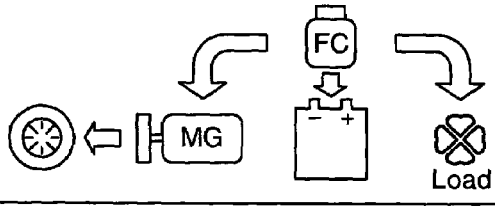 | STATE DETECTION DISABLED |
| ③ DURING ACCELERATION ASSIST | 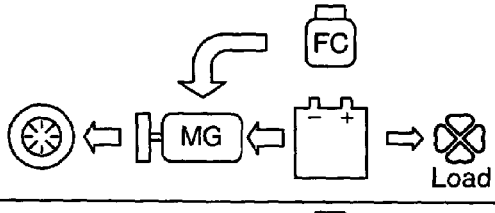 | STATE DETECTION DISABLED |
| ④ DURING ACCELERATION/ RUNNING | 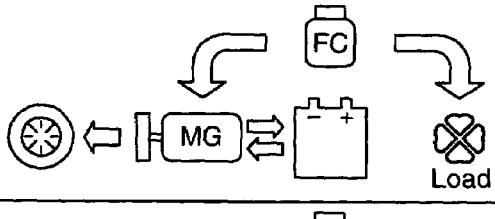 | STATE DETECTION DISABLED |
| ⑤ DURING SPEED REDUCTION | 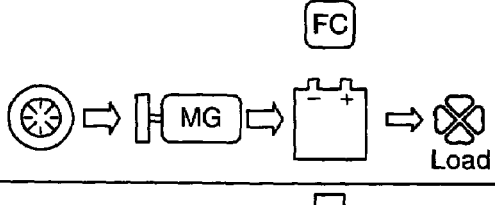 | STATE DETECTION ENABLED |
| ⑥ AT VEHICLE STOP, LARGE REMAINING AMOUNT | 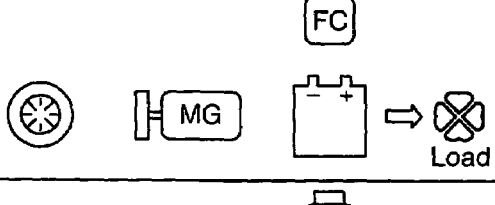 | STATE DETECTION ENABLED |
| ⑦ AT VEHICLE STOP, SMALL REMAINING AMOUNT | 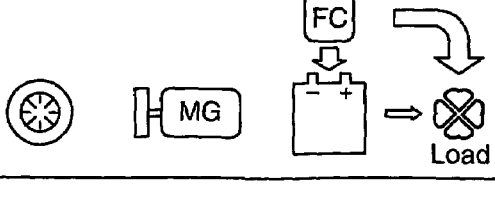 | STATE DETECTION ENABLED |

# BATTERY APPARATUS AND METHOD FOR MONITORING BATTERY STATE OF A SECONDARY BATTERY

BACKGROUND OF THE INVENTION

The present invention relates to a secondary battery (hereinafter, simply referred to as a battery) evaluating method and a battery apparatus and in particular, to a method for evaluating remaining amount and service life of a battery mounted on a vehicle.

A lead battery is mounted as a secondary battery on a vehicle such as an automobile so as to serve as energy source for starting an engine, illumination, fuel injection device. In this case, it is necessary to accurately evaluate the remaining amount and service life of the lead battery. For example, after an engine is stopped, if there is no lead battery for supplying sufficient power for starting the engine next time, the engine cannot be started.

In general, the battery power is limited by a battery internal impedance. As the remaining amount decreases and the service life approaches its end, the internal impedance becomes larger. In order to maintain the engine start power, it is desired to accurately evaluate and control the battery remaining amount and service life.

Conventionally, there has been suggested a method for detecting a battery service life by measuring the internal impedance of the battery. JP-A-2001-235525 discloses a method for applying two types of AC current to a battery to measure an impedance and calculating the battery service life according to the measurement result.

[Document 1]
JP-A-2001-235525 ([0045]–[0046], FIG. 7)

In Document 1, the remaining amount is calculated by referencing the past judgment result. However, no consideration is taken on the affect of the change of the remaining amount as the time elapses, and if a comparatively large load such as an air conditioner is operated during idol stop, there arises a problem that the remaining amount cannot be followed. Moreover, since the internal impedance of the lead battery changes depending on the remaining amount, the service life calculated from impedance not considering the remaining amount lacks in reliability.

Moreover, in the case of a drive battery for a hybrid vehicle and fuel battery vehicle, the battery characteristic cannot be measured during running. Accordingly, there is a danger that there arise problems that power up cannot be performed during running or the engine cannot be started upon re-start.

SUMMARY OF THE INVENTION

It is therefore an object of the present invention to provide a secondary battery evaluating method capable of accurately detecting a battery remaining amount and service life and a battery apparatus for that. Another object of the present invention is to provide a secondary battery evaluating method capable of diagnosing battery characteristic of a drive battery of a hybrid vehicle and the like during running without using another power source and a battery apparatus for that.

In order to achieve the aforementioned object, the present invention provides a method for evaluating characteristic of a secondary battery passing power to/from one or more electric devices mounted on a vehicle, the method comprising steps of: measuring the current and voltage of the secondary battery according to a plurality of frequencies generated by the one or more electric devices, calculating impedance of the secondary battery from the measurement results, and evaluating the battery characteristic of the secondary battery from the impedance calculated.

The electric device is a motor/generator for generating electricity by receiving drive force from the vehicle or a generator driven by the internal combustion engine which is a drive source of the vehicle, the motor/generator or the generator lighting the direction indication lamps of the vehicle, being arranged in the direction indicating device generating a particular frequency or an internal combustion engine as a drive source of the vehicle, and driving the fuel injection apparatus generating a particular frequency and the vehicle.

The electric device is a motor/generator for driving the vehicle and generating electricity by receiving drive force from the vehicle and during non-power running period of the motor/generator, the electric device suppresses the output of the motor/generator and successively changes the frequency of the state detection current applied to the secondary battery so as to measure the current and voltage of the secondary battery.

Moreover, the electric device is a motor/generator for driving the vehicle and generating electricity by receiving drive force from the vehicle, and the method comprises steps of: controlling the motor/generator during a non-power running period of the motor/generator, measuring the current and voltage of the secondary battery while changing the frequency of the state detection current applied to the secondary battery, calculating the impedance from the measurement results, calculating the remaining amount of the secondary battery from the impedance and the battery characteristics, calculating a parasitic capacity of the secondary battery from the remaining amount and the impedance, performing deterioration calculation to obtain a service life, calculating a correction value of the change of the remaining amount or the service life according to the integration current of the secondary battery successively measured during the impedance calculation, maintaining an error of the calculation result of remaining amount or the service life up to the preceding time, calculating an error of the calculation result this time after correcting the change from the preceding calculation result, and calculating a weighted mean according to the preceding error and the current error.

The battery consists of a plurality of sets of batteries and uniform charge is performed periodically for charging all the batteries to the full charge, after which the remaining amount of the battery is calculated.

Moreover, the electric device is a generator driven by an internal combustion engine of the vehicle and measure current and voltage of the secondary battery while controlling the output of the generator and changing the frequency of the state detection current applied to the secondary battery, the method comprising steps of: calculating an impedance from the plurality of measurement results, calculating the remaining amount of the secondary battery from the impedance and the battery characteristic, calculating a parasitic capacity of the secondary battery from the remaining amount and the impedance, performing deterioration calculation according to the parasitic capacity of the secondary battery to obtain a service life, calculating a correction value of the change of the remaining amount or the service life according to the integration current of the secondary battery successively measured during the impedance calculation, maintaining an error of the calculation result of remaining amount or the service life up to the preceding time, calculating an error caused by the current calculation result in which the change from the preceding calculation result is corrected, and obtaining a weighted mean of the error of the preceding error and the current error.

In order to achieve the aforementioned object, according to another aspect of the present invention, there is provided a secondary battery evaluation method for evaluating a secondary battery by calculating the impedance according to measurement results of current and voltage of the secondary battery and referencing the battery characteristic, the method comprising steps of: calculating the impedance while successively changing the frequency of the current flowing to the secondary battery, calculating the remaining amount of the secondary battery from the impedance and the battery characteristic, calculating a correction value of the remaining amount change according to an integration current of the secondary battery successively measured during impedance calculation, and calculating the remaining amount of the secondary battery by averaging the remaining amount and the correction value.

The method comprises steps of: performing deterioration calculation according to the parasitic capacity of the secondary battery obtained from the remaining amount and the impedance, so as to obtain a service life, calculating a second correction value by correction of the service life change based on the integration current, and averaging the service life and the second correction value, so as to obtain the service life of the secondary battery.

Moreover, the method comprises steps of: maintaining an error by the calculation result of the remaining amount or the service life up to the preceding time, calculating an error of the calculation result this time after correcting the change from the preceding calculation result, and obtaining a weighted mean of the preceding error and the current error.

Moreover, the interval ($t_{intval}$) for calculating the remaining amount is optimized according to the error of the integration current.

Moreover, the deterioration calculation is corrected according to the parasitic capacity of the secondary battery and temperature characteristic.

The impedance calculation is performed by selecting three or more points from a frequency range 1 to 1000 Hz and measuring the current and voltage of the secondary battery according to the operation of the AC current load indicating one of the frequency points, after which the current and voltage of the other points are measured.

The calculation of the remaining amount or the service life employs both of the calculation method based on the impedance and the calculation method based on the integration current detection performed successively during the impedance calculation and the calculation results of the calculation methods are subjected to weighted mean.

A battery apparatus according to the present invention is for evaluating battery characteristic of a secondary battery passing power to/from one or more electric devices mounted on a vehicle and comprises: control means for applying the state detection current by a plurality of frequencies generated by operation of the one or more electric devices to the secondary battery, impedance calculation means for measuring current and voltage of the secondary battery based on the frequency and calculating the impedance of the secondary battery from the measurement results, storage means containing characteristic relationship between the remaining amount and the impedance of the secondary battery, and battery characteristic calculation means for evaluating the battery characteristic of the secondary battery for the impedance calculated according to the characteristic relationship.

The electric device is a motor/generator for driving the vehicle and generating electricity by receiving the drive force from the vehicle or a generator driven by an internal combustion engine as a passive source of the vehicle and the control means detects a non-power running period of the motor/generator, stops output of the motor/generator or the generator, and changes the frequency of the state detection current applied to the secondary battery.

According to still another aspect of the present invention, there is provided a battery apparatus comprising: a voltage/current detection unit for detecting voltage and current of a secondary battery, a storage unit for storing battery characteristics of the secondary battery calculated in advance so as to be referenced, and a CPU having an impedance calculation unit for calculating the impedance of the secondary battery from the detected voltage and current, a remaining amount calculation unit for calculating the remaining amount of the secondary battery according to the calculated impedance and the battery characteristics, a remaining amount change correction unit for correcting the remaining amount change according to an integration current of the secondary battery, a service life calculation unit for calculating the service life of the secondary battery according to the parasitic capacity calculated by the impedance calculation unit and the remaining amount calculated by the remaining amount calculation unit, and a service life change correction unit for correcting the service life change, wherein the calculation results of the remaining amount calculation unit and the remaining amount change correction unit and/or the service life calculation unit and the service life change correction unit are subjected to weighted mean to obtain the remaining amount and/or the service life of the secondary battery.

Control is made to apply a state detection current of frequency range of 1 to 1000 Hz to the secondary battery and the impedance is calculated at three or more points in the frequency range.

Moreover, the voltage/current detection unit includes two systems, i.e., AC detection means and DC detection means.

Other objects, features and advantages of the invention will become apparent from the following description of the embodiments of the invention taken in conjunction with the accompanying drawings.

BRIEF DESCRIPTION OF THE DRAWINGS

FIG. 12 shows hybrid vehicle control modes and energy flow.

FIG. 18 shows configuration of an electric system of a fuel battery vehicle as still another application example of the present invention.

FIG. 19 shows fuel battery vehicle control modes and energy flow.

DESCRIPTION OF THE EMBODIMENTS

Description will now be directed to embodiments of the present invention with reference to the attached drawings. The present invention has three main technical features. The first technical feature is what is measured as battery characteristic to know the battery state. The second technical feature is a method for generating a signal required for the measurement. The third technical feature is a method for accurately calculating the battery state from the measurement result.

Figure 1:
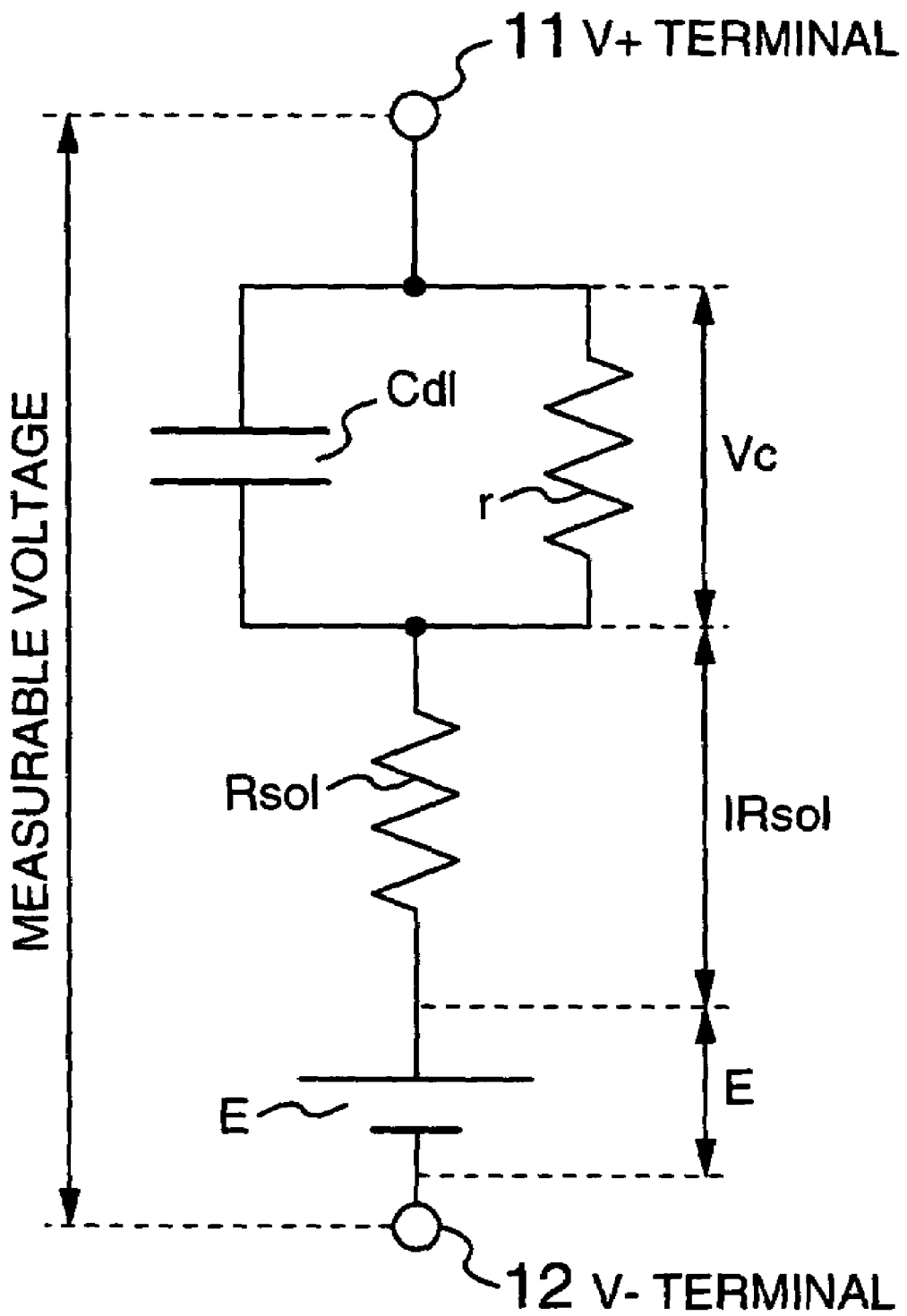
FIG. 1 is a circuit diagram showing an equivalent circuit of a battery.

Firstly, explanation will be given on the battery characteristic. FIG. 1 is a simplified equivalent circuit model of a battery. The model includes a V+ terminal 11 which is an anode terminal of the battery, a V− terminal which is a cathode terminal of the battery, a feeding voltage E of the battery, a DC internal resistor Rsol, parasitic capacity Cdl, and discharge resistor r of the parasitic capacity. Among these, E, r, and Cdl serve as parameters for judging the remaining amount and the service life. It is possible to directly measure the battery voltage V between the V+ terminal and the V− terminal, current I flowing in the battery, and the temperature T of outside of the battery case. Moreover, the Vc is a polarized voltage of Cdl and IRsol is a voltage drop generated by the DC internal resistor Rsol and the charge/discharge current I. It is difficult to directly measure the E, Rsol, Cdl, r, Vc, and the like.

In this embodiment, explanation is given on a simplified equivalent circuit. However, it is also effective to add another pair of r and Cdl, so as to separately express the reaction of the anode and the cathode. Moreover, it is also possible to add to r a model considering the diffusion of the reaction product.

Figure 2:
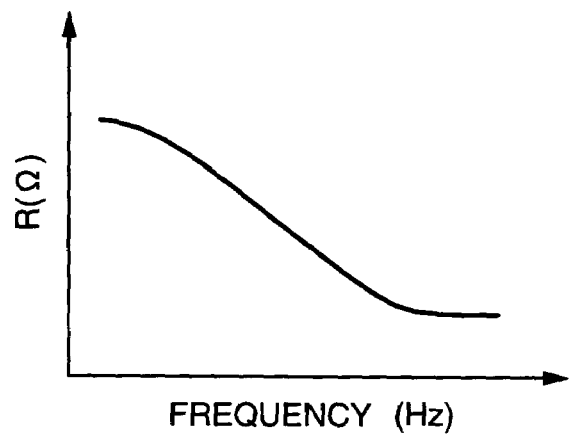
FIG. 2 shows the relationship between the impedance and the frequency of the battery.

FIG. 2 shows an example of measurement result of the internal resistance of the battery. The vertical axis represents an absolute value R of the battery internal resistance which is equivalent to the total of Cdl, r, and Rsol of FIG. 1. The horizontal axis represents frequency f. Accordingly, the impedance of the entire equivalent circuit is defined by Equation 1. ω=2πf.

$$R = Rsol + (r/(1+jwC_{dl}))$$ (Equation 1)

Figure 3:
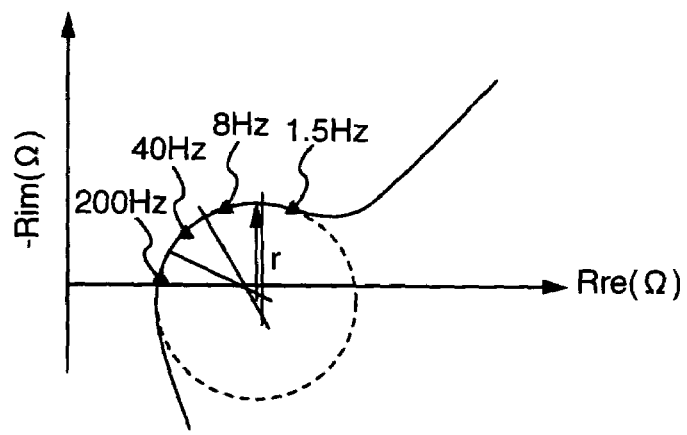
FIG. 3 shows an impedance measuring method from the relationship between the battery impedance real part, imaginary part, and the frequency.

FIG. 3 shows an impedance measurement result expressing the relationship between the real component $R_{re}$ and the imaginary component $R_{im}$ of the impedance of the entire equivalent circuit. The measurement result obtained by using a high-accuracy impedance measurement apparatus is expressed by a solid line and the measurement result by the measurement method according to the present embodiment is expressed by back triangles. The horizontal axis expresses the real part of the impedance and the vertical axis expresses the imaginary part of the impedance in which the axis is reversed.

In FIG. 3, two points are selected from the three measurement result points and a perpendicular bisector is drawn and their intersection point is determined to specify a center of impedance circle shown by a broken line. Furthermore, by increasing the number of measurement points, the number of the intersection points of the perpendicular bisectors is increased. By calculating their center of gravity, it is possible to increase the reliability. Moreover, by calculating the standard deviation of the intersection points of the perpendicular bisectors, it is possible to use it as a reliability index.

In this embodiment, impedance measurement is performed at four points. Arbitrary four points are selected from the frequency range of 1 to 1000 Hz. Here, the experiment result shows that 1.5 Hz, 8 Hz, 40 Hz, and 200 Hz are optimal. This frequency is valid when the lead battery is used. In the case of lithium ion battery and nickel-hydrogen battery for hybrid vehicle, the optimal frequency is 5 Hz to 5 kHz. In the case of lithium polymer battery, the optimal frequency is 0.1 to 500 Hz. Thus, the experiment results show that optimal frequency varies depending on the battery type and design.

FIG. 4 to FIG. 8 show battery characteristics. The measurement condition is that the DC current component is a constant value. These characteristics are changed when the DC current component is changed. Conventionally, since the DC component is not taken into consideration, an adverse affect has been given to the accuracy of measurement on the vehicle. In this embodiment, the DC current component is about 0.5 C at the discharge side. Here, 1 C is a current to discharge all the capacity for one hour. For example, 0.5 C corresponds to 5A in the batter of 10 Ah. In this embodiment, impedance is measured while maintaining the discharge side DC current constant. This constant state can be obtained by controlling the generation amount of the motor/generator.

Figure 4:
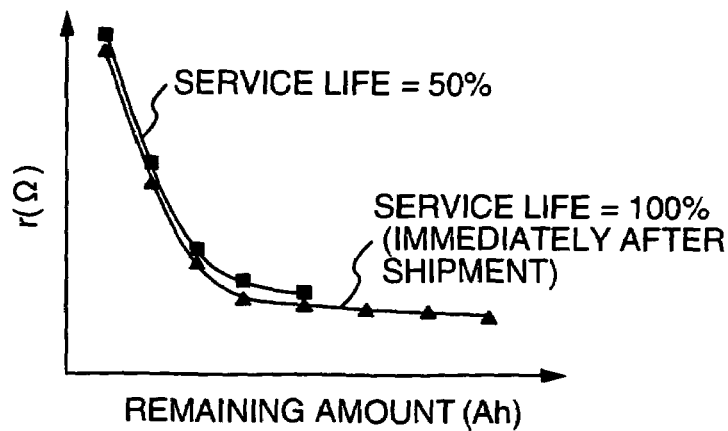
FIG. 4 shows the relationship between the "r" and the remaining amount of the battery.

FIG. 4 shows relationship between r, remaining amount, and service life of the lead battery. In the region where the remaining amount is small, the inclination of r against the remaining amount is large. By converting the measurement result r into the remaining amount, it is possible to calculate the remaining amount which can be used in practice. However, the lead battery is used in the remaining amount region near to the full charge, i.e., at the right side of FIG. 4. In this region, the inclination of the r against the remaining amount is small. If a remaining amount is calculated from the r measurement result, an error is large and the remaining amount calculated cannot be used in practice. Moreover, in the case of the lead battery, the upper limit of the remaining amount becomes smaller as the service life becomes shorter. To cope with this, in this embodiment, the capacity is defined by the remaining amount in the full charge and the service life is defined as a ratio of the current capacity against the initial capacity.

Figure 5:
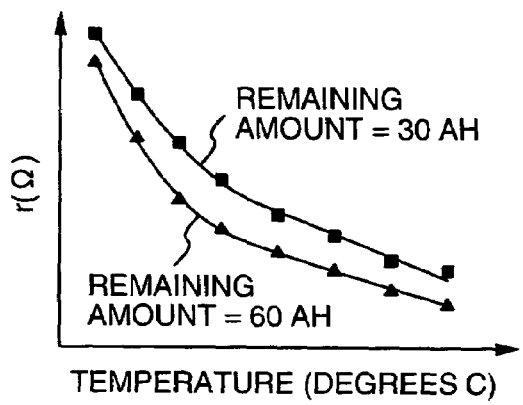
FIG. 5 shows the relationship between the "r" and the temperature of the battery.

FIG. 5 shows the relationship between the r and the temperature. The r becomes smaller as the temperature increases. Moreover, the r is more sensitive to the temperature than to the remaining amount. Accordingly, in this embodiment correction of the characteristic is performed by the temperature.

Figure 6:
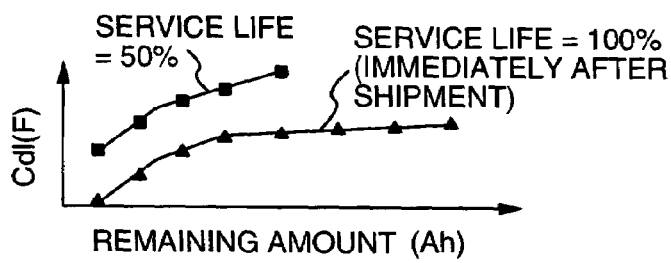
FIG. 6 shows the relationship between the "Cdl" and the remaining amount of the battery.

FIG. 6 shows relationship between Cdl and the remaining amount. As the remaining amount becomes greater, the Cdl becomes greater. Moreover, as the service life becomes shorter, Cdl becomes greater. This characteristic is due to the fact that when the service life becomes shorter, the active material particles of the lead battery become smaller and the surface area is increased. By this characteristic, it is possible to calculate the service life from Cdl and the remaining amount. The present invention is based on finding this characteristic. By combining the calculation method for accurately calculating the remaining amount and the Cdl measurement method, it has become possible to judge the service life. As another deterioration form, the active material particles are separated from the electrode and become inactive not to receive charging. However, it is possible to perform the remaining amount measurement after the uniform charging completion (upon full charging). The details will be described later.

Figure 7:
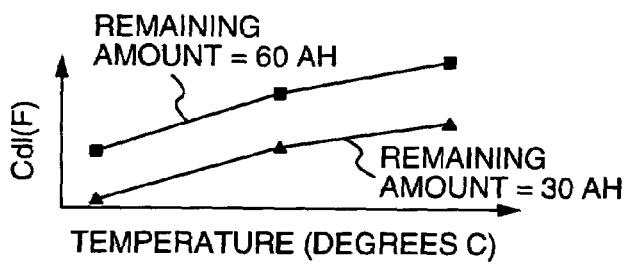
FIG. 7 shows the relationship between the "Cdl" and the temperature of the battery.

FIG. 7 shows the relationship between the Cdl and the temperature. As the temperature increases, the Cdl slightly increases. However, as compared to r, the temperature dependency is small. In this embodiment, correction of characteristic is also performed by the temperature of the Cdl.

Figure 8:
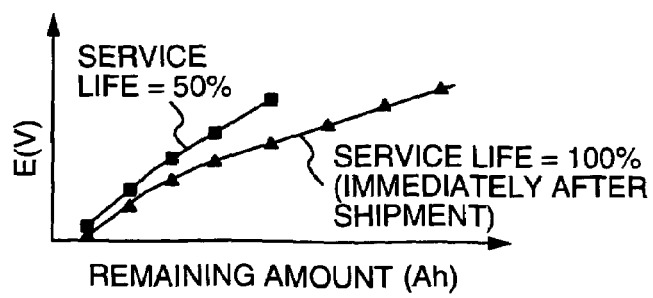
FIG. 8 shows the relationship between the feeding voltage E and the remaining amount of the battery.

FIG. 8 shows the relationship between the feeding voltage E and the remaining amount of the lead battery. Theoretically, the feeding voltage E is changed by the concentration of the electrolyte liquid. As the remaining amount increases, the feeding voltage becomes higher and the inclination against the remaining amount becomes almost constant. Moreover, as the service life decreases, the E inclination against the remaining amount becomes steep as the liquid amount becomes lower.

Next, explanation will be given on the hardware configuration of the battery apparatus according to the present invention and the method for generating a signal required for measurement. The main portion of the battery apparatus is called a battery controller in this embodiment.

Figure 9:
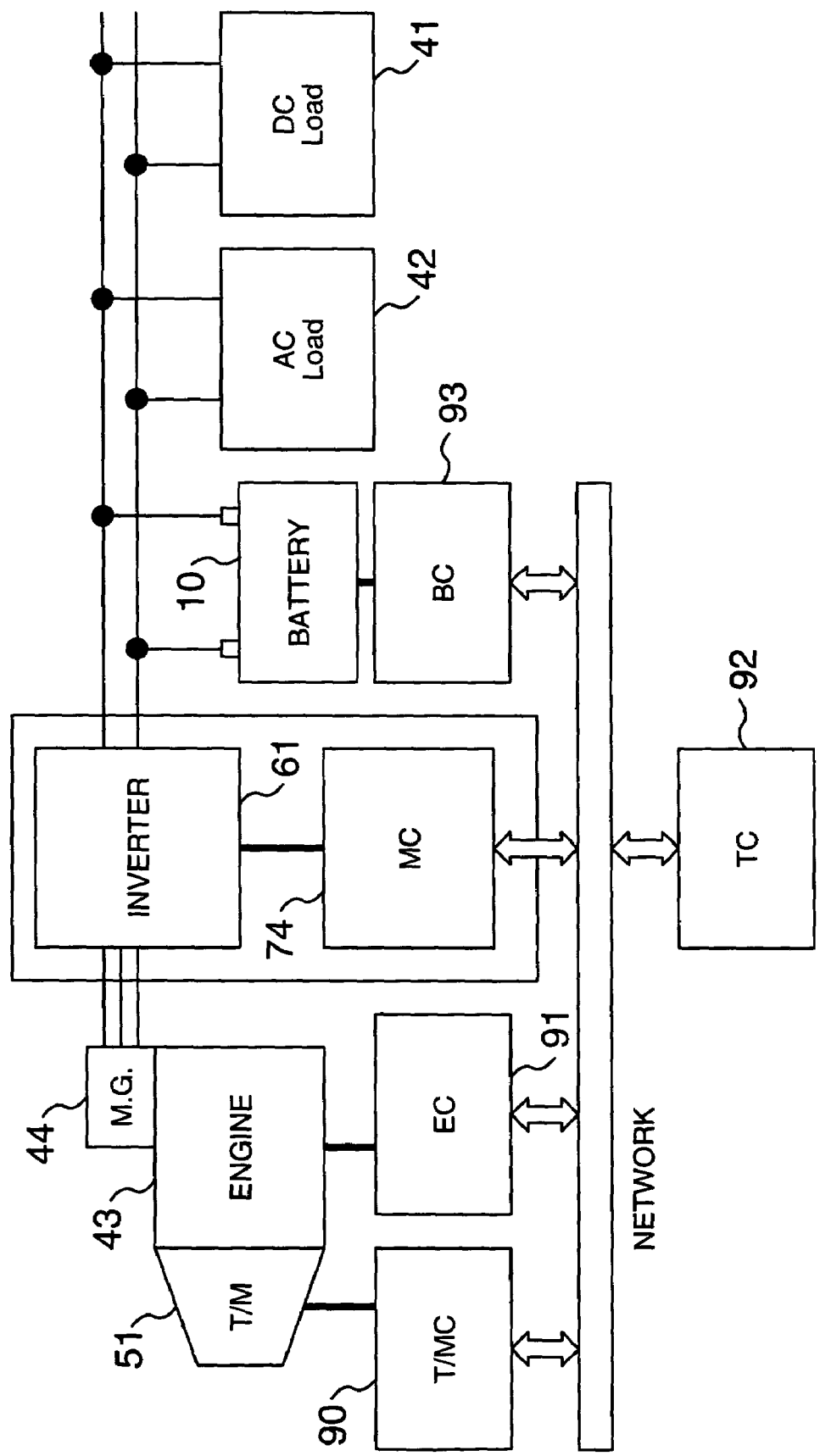
FIG. 9 shows configuration of power train of a hybrid vehicle.

FIG. 9 is a block diagram showing a power train of a hybrid automobile or vehicle. An engine 43 is controlled by an engine controller 91 and mechanically connected to a transmission 51 and MG (motor generator) 44. The transmission 51 is controlled by a transmission controller 90 and transmits the drive force of the engine 43 to tires. The MG 44 is electrically connected to an inverter 61 to receive/transmit electric energy from/to the battery via the inverter 61 and pass mechanical energy with the engine 43 and the drive shaft of the vehicle. The inverter 61 is controlled by a motor controller 74, so as to control energy flowing between the battery 10 and the MG 44, thereby controlling operation of the MG 44. The battery 10 is connected to the battery controller 93, which monitors the state of the battery 10. An ACLoad 42 is an electric load operating by a particular cycle (for example, about 1 Hz of the direction indicator, about 200 Hz of the fuel injection apparatus) and connected to the battery 10. A DCLoad 41 is the other electric load connected to the battery 10. The transmission controller 990, the engine controller 91, the motor controller 74, the battery controller 93, and the total controller 92 are connected to one another via a network. The total controller 92 issues a control instruction to the other controllers so as to control running of the hybrid vehicle.

Figure 10:
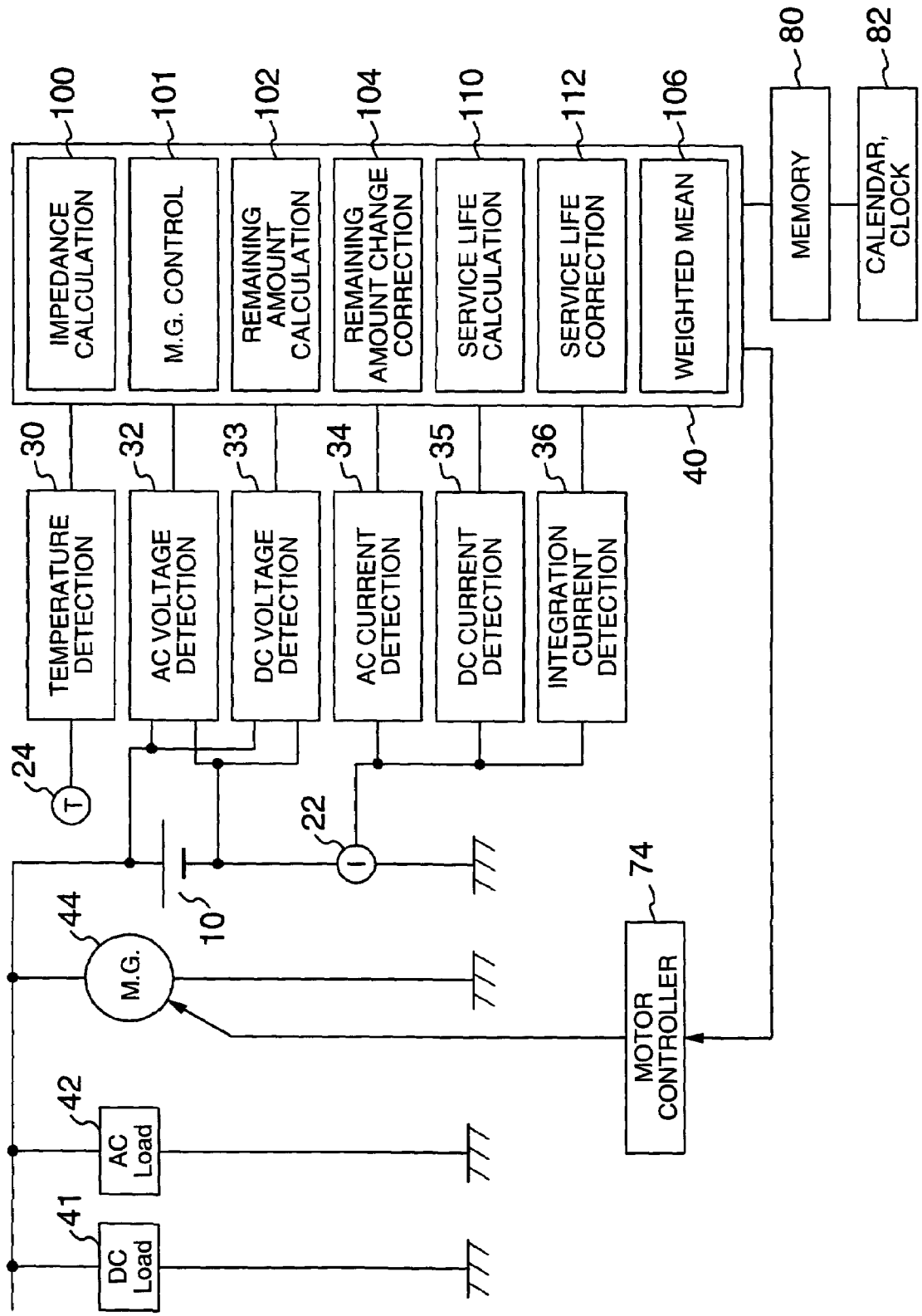
FIG. 10 shows configuration of a vehicle battery controller (battery apparatus) according to an embodiment of the present invention and its peripheral devices.

FIG. 10 is a block diagram showing the battery controller and its periphery. The secondary battery 10 is a set battery having a plurality of cells connected in series. As a load of the battery 10, the MG 44 representing a motor generator, a starter motor, a generator, and the like, the ACLoad 42 operating by a specific cycle such as the direction indicator and the fuel injection apparatus, and the other load DCLoad 41 are connected. The current sensor 22 and the temperature sensor 24 convert the current and the temperature of the battery 10 into voltage signals, respectively.

The CPU 40 includes an impedance calculation unit 100, an MG control unit 101, a remaining amount calculation unit 102, a remaining amount change correction unit 104, a weighted averaging unit 106, a service life calculation unit 110, and a service life correction unit 112 and performs various calculations and controls explained below. The remaining calculation unit 102 to the service life correction unit 112 may be called all together an electric characteristic calculation unit. Details of the calculation and control will be given later. A memory 80 holds the measurement data and the battery characteristic or the calculation result data shown in FIG. 2 to FIG. 8. A calendar/clock 82 defines the control operation of the CPU 40.

The CPU 40 acquires the battery temperature via a temperature detector 30. Moreover, the CPU 40 acquires the AC voltage after removing the DC component via an AC voltage detector 32, DC voltage via a DC voltage detector 33, AC current from which DC component is removed via an AC current detector 34, and DC current via a DC current detector 35. An integration current detector 36 periodically acquires the integration value of current coming in and going out to/from the battery 10. Moreover, the CPU 40 applies the control instruction of the MG control processor 101 to the motor controller 74 to control the MG and generate a state detection current. It should be noted that the functions of the MG control processor 101 and the motor controller 74 may be referred to as MG control means.

Figure 11:
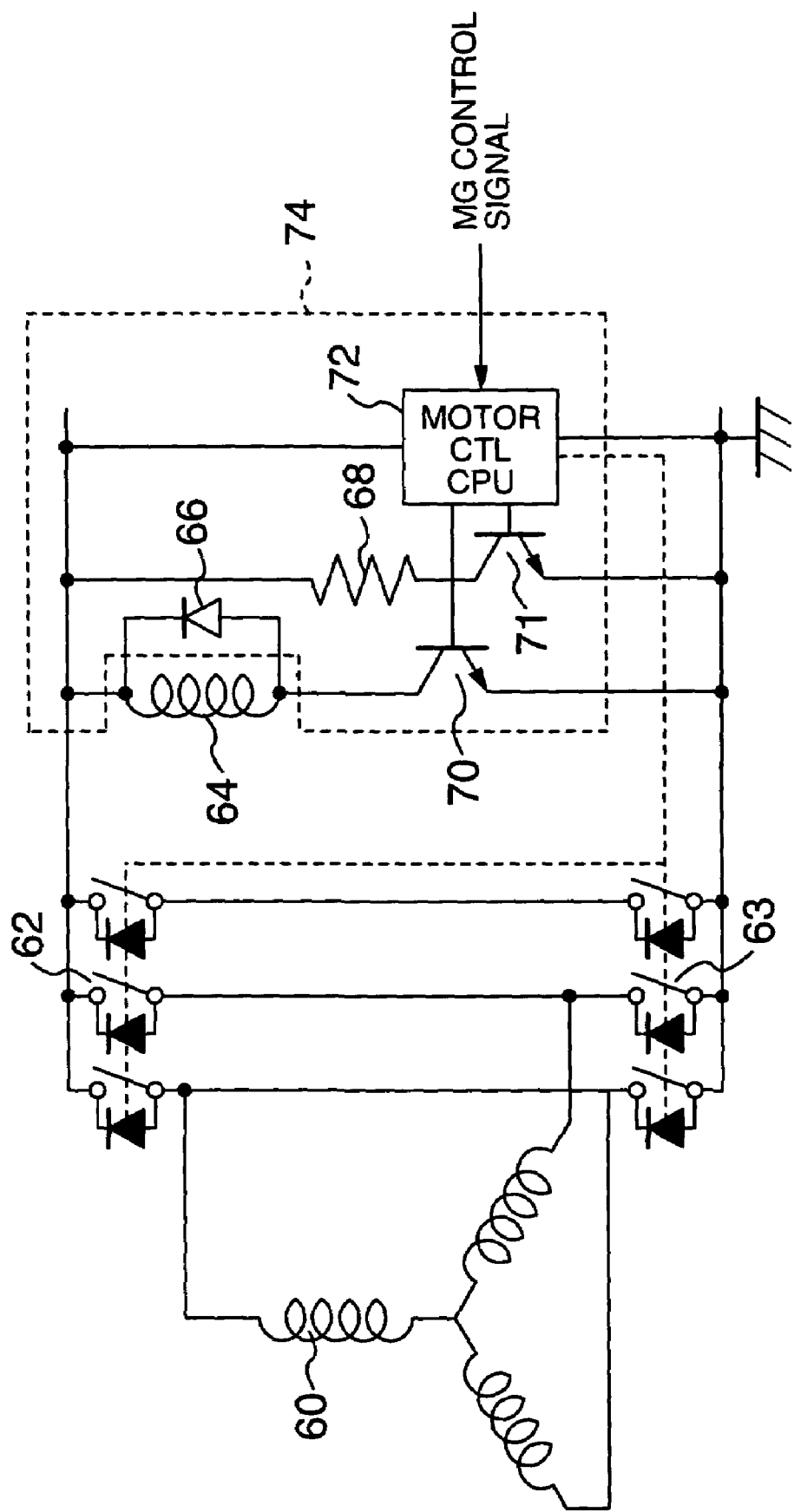
FIG. 11 shows a control circuit diagram of a motor controller.

Next, explanation will be given on the method for generating the battery state detection signal current. FIG. 11 shows an example of the MG and the motor controller. The motor controller operates according to an MG control instruction from the MG control unit 101. The stator winding 60 as a generating coil consists of three phases, which are Y-connected (or delta-connected). In the case of the Y connection shown in FIG. 11, one side of each of the three windings is connected to the neutral point and the other end is connected to the inverter 61. Between an upper arm 62 of the plus side and a lower arm 63 of the minus side, there is arranged a motor controller CPU 72 for controlling current of the field winding while the battery 10 and the loads 41, 42 are connected outside. Moreover, in this embodiment the switching element 71 and the resistor 68 for generating the battery state detection signal are connected to the battery 10 and the motor controller CPU 72.

The MG control instruction from the CPU 40 is input to the motor controller CPU 72. The motor controller CPU 72 also detects generation voltage by the resistor 68 so as to perform normal voltage control. The MG control apparatus 74 has a built-in switching element 70 for controlling a current value to flow into the field winding 64 having a diode 66 connected in parallel therewith. By changing the time ratio of the ON/OFF states of the switching element 70, the average voltage applied to the field winding 64 is changed to control the magnetomotive force of the rotor.

More specifically, the generation voltage is detected by the resistor 68. When the generation voltage is low, the duty of the switching element is increased so as to increase the field current. On the contrary, when the generation voltage is high, the duty is controlled to be reduced to obtain a constant voltage appropriate for generation. Moreover, there is a method to rectify the three-phase current generated by the stator winding 60 by means of the parasitic diode of the upper arm 62 and a method for rectifying the current by controlling the upper and the lower arms.

A large ripple current flows into the battery when rectifying the AC current generated by the stator winding 60 by using the inverter 61. For this, it has been difficult to obtain the battery state detection signal current greater than the ripple current and difficult to detect the battery state.

Moreover, during power running of the MG 44, the duty of the switching element 70 is controlled to be a predetermined value, the magnetomotive force is maintained to be constant, the inverter 61 is controlled so that current flows from the battery 10 to the stator 60 and torque of the power running side is generated in the MG.

In this embodiment, when an MG control instruction comes from the CPU 40 to the motor controller CPU 72, the switching element 70 is turned off, the current of the field winding 64 is reduced, and the generation is stopped. Next, the switching element 71 is driven by the frequency of the control instruction and transmits a signal current for state detection to the battery.

Moreover, in the case of a high-output MG having a permanent magnet in addition to the field winding 64 as the rotor, generation cannot be stopped by cutting off the current of the field winding 64. For this, all of the three switches of the lower arm 63 of the inverter are turned off and the stator winding 60 can be short-circuited to stop generation. Alternatively, it is possible to generate a signal current for state detection by using the switching element 70 instead of the switching element 71.

Thus, according to the present embodiment, it is possible to apply the battery state detection signal to the battery while eliminating the affect of the ripple current by the MG generation and to detect the battery state with a high accuracy even during running of the vehicle. Moreover, another power source has been used conventionally to apply a signal current to the battery but it has become possible to detect the battery state by controlling the motor controller and the inverter without using a separate power source.

In the case of hybrid vehicle application, the MG 44 not only generates electricity but also drives the vehicle. Accordingly, signal generation for battery state detection should correspond to the vehicle control state. FIG. 12 shows flow of the control modes and energy in the hybrid vehicle.

(1) represents a start from the engine stop state. Energy is transmitted from the battery to the MG, from the MG to the engine and tires. Thus the engine start and vehicle drive are performed. In this case, the MG is in power running. If the drive force is changed for battery state detection, the vehicle behavior becomes not smooth. Accordingly, no signal generation is performed for battery state detection.

(2) shows a case when the vehicle is started during engine operation and energy is transmitted from the engine to the tires, to the MG, and from the MG to the battery. Here, the MG is generating electricity. Even if the generation is stopped, its affect to the vehicle behavior is small. Accordingly, signal generation for the battery state detection is allowed.

(3) shows a case of rapid acceleration. Energy flows from the battery to the MG, from the MG and the engine to the tires. Here, the MG is in power running. If the power running is stopped, the vehicle acceleration becomes slow. Accordingly, the signal generation for the battery state detection is not performed.

(4) shows a case of normal acceleration and running. Energy flows from the engine to the tires and the MG, from the MG to the battery. Here, the MG is generating electricity. Even if the generation is stopped, the affect to the vehicle behavior is small. Accordingly, the signal generation for the battery state detection is allowed.

(5) shows a case of speed reduction. Energy flows from the tires to the MG, from the MG to the battery. Here, the MG is in generating state. Even if the generation is stopped, the affect to the vehicle behavior is small if cooperated with the brake control. Accordingly, the signal generation for the battery state detection is allowed. However, in the case of a sudden brake operation, it is preferable not to stop generation so as to collect more kinetic energy for the vehicle. In such a case, the signal generation for the battery state detection is not performed.

(6) shows a case when the engine and the vehicle are in the stop state. Energy flows from the battery to the load such as the air conditioner and lamps. Here, the MG may be driving the compressor of the air conditioner. However, it is possible to stop the compressor or change the rpm for several seconds. Accordingly, the signal generation for the battery state detection is allowed.

(7) shows a case when the engine is operating while the vehicle is in the stop state. Energy flows from the engine to the MG, from the MG to the battery and the load such as the air conditioner and the lamps. Here, the MG is generating electricity. Even if the generation is stopped, the affect to the vehicle behavior is small. Accordingly, the signal generation for the battery state detection is allowed.

Thus, since the MG performs the both roles of generation and drive, it is not preferable to change the drive force during the power running while the MG is driving for the battery state detection. Accordingly, in this embodiment, the signal generation for the battery state detection is not performed during power running of the MG. More specifically, the battery controller 93 receives a signal indicating the power running of the MG 44 from the total controller 92 and the battery state detection signal is not generated during the power running.

Figure 13:
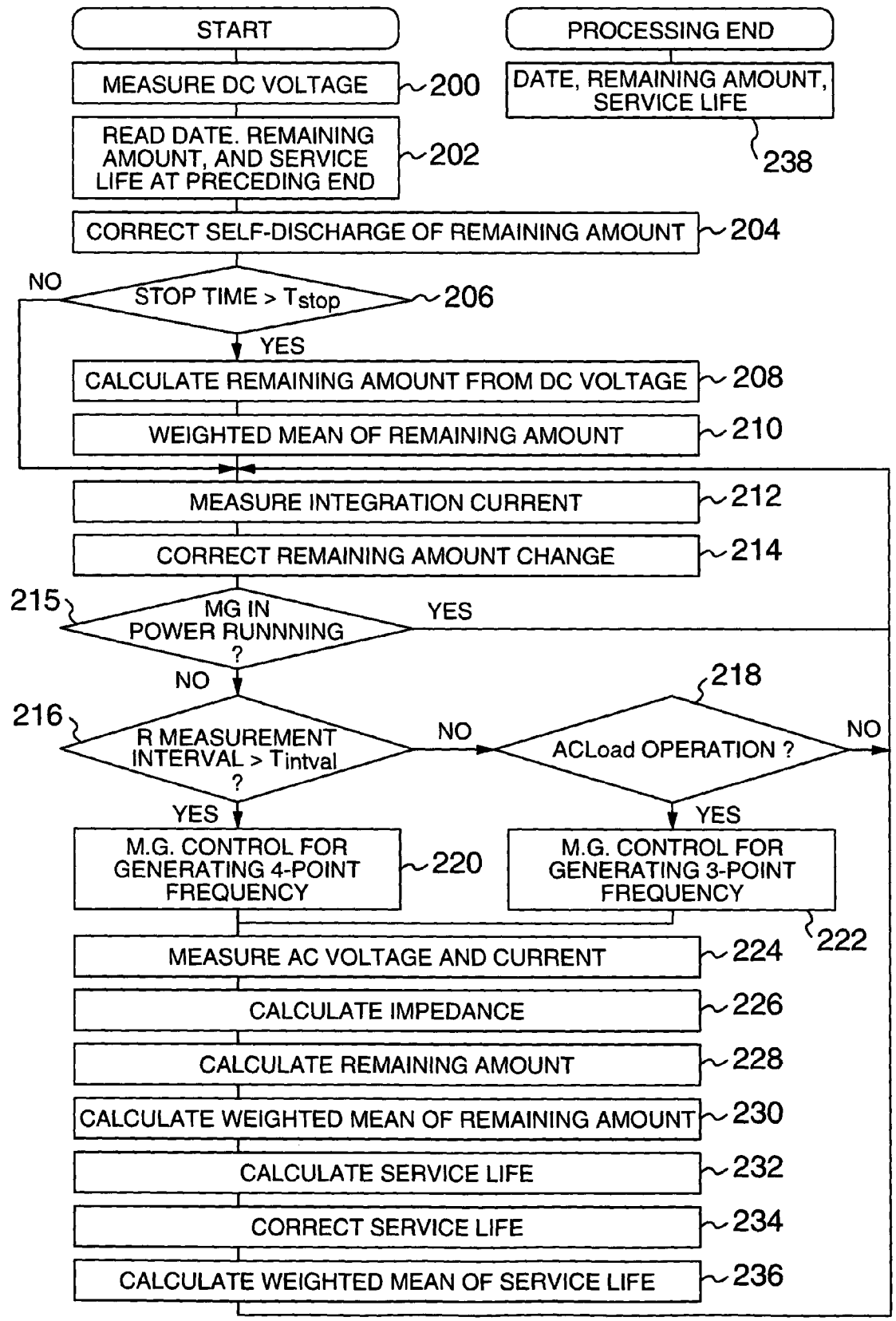
FIG. 13 is a flowchart of battery state detection according to an embodiment of the present invention.

Next, explanation will be given on the method for calculating the battery state with a high accuracy from the measurement result. FIG. 13 is a flowchart showing the processing of the CPU 40. Firstly, immediately after the vehicle ignition key is turned on, the battery DC voltage is measured (200) and the date when the ignition key is turned off previously, the remaining amount, the remaining amount error, the service life, and the service life error are read in from the memory 80 (202). These values are stored in the memory 80 when the ignition key is turned off previously (238).

Next, the date of the preceding end is subtracted from the current date to obtain atop time. By using the temperature at the start, the self-discharge of the remaining amount is corrected according to Equation 2 (204).

$$SOCb = SOC - \alpha t \log_{10}(T-25) \quad \text{(Equation 2)}$$

wherein $\alpha$ is the self-discharge rate at temperature 25 degrees C., t is a stop time, SOC is the remaining amount upon previous end read from the memory, and T is a temperature. In general, it is known that the self-discharge is doubled by 10 degrees C. Accordingly, it is possible to calculate the self-discharge considering the temperature coefficient during the stop state. Moreover, the remaining amount error σ is corrected according to Equation 3 and σb is calculated.

$$\sigma b = \beta t \quad \text{(Equation 3)}$$

wherein β is a standard deviation of individual difference of the self-discharge rate and the change as the time elapses.

The error may be an offset, a gain error, a random error, or the like. In this embodiment, only the random error is included and the standard deviation is employed as the error index. As a result, it has become possible to apply the data to a statistical formula. By evaluating and combining the battery state accuracy data obtained by a plurality of methods, it is possible to calculate the battery state with the theoretically best accuracy.

Next, it is decided whether the aforementioned stop time is not smaller than a first threshold value ($t_{stop}$) (206). When the stop time is not smaller than the first threshold value, the remaining amount is calculated by using the battery characteristic of FIG. 8 according to the DC voltage measured in step 200 and the service life read in step 202 (208). The first threshold value is, for example, a week.

When a battery is left as it is for a long time the reliability of the data on the remaining amount recorded upon the previous end is lowered by the individual difference of the self-discharge. On the contrary, the voltage component is sufficiently attenuated by the past current history and the reliability of the DC voltage measurement result is increased. To cope with this, when the stop time is not smaller than the first threshold value, the remaining amount is calculated from the DC voltage according to Equation 4 and it is used together with the remaining amount obtained by correcting the self-discharge from the remaining amount at the previous end.

$$SOCa = SOCtable\_v(V) \quad \text{(Equation 4)}$$

wherein $SOC_{table\_v}$ is a function to convert the feeding voltage E into the remaining amount from the relationship between the feeding voltage E of FIG. 8 and the remaining amount.

Figure 14:
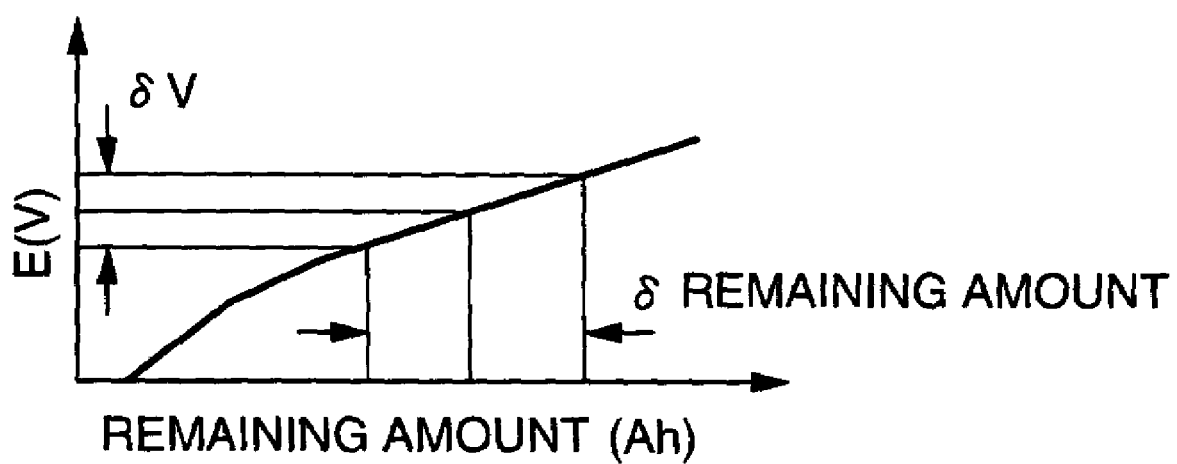
FIG. 14 explains calculation of a remaining amount error according to E in the relationship of FIG. 8 and a voltage measurement error δ.

FIG. 14 shows a method for calculating the remaining amount. Addition/subtraction of the voltage measurement error is performed to the DC voltage measurement result to be converted into the remaining amount and the error σa is calculated from Equation 5. Here, the DC voltage measurement error σv is set in advance and the error σa of the remaining amount is calculated. The calculation of the remaining amount from this DC voltage is the remaining amount calculation method 1 in this embodiment.

$$\sigma a = SOCtable\_v(V - \sigma_v) - SOCtable\_v(V + \sigma_v) \quad \text{(Equation 5)}$$

In the weighted averaging of the remaining amount (210), the remaining amount SOCa calculated from the DC voltage and its error σa and the remaining amount SOCb calculated by correcting the change (self-discharge) from the remaining amount of the previous end and its error σb are received to calculate the weighted averaging according to Equation 6.

$$SOC = Wa \times SOCa + Wb \times SOCb \quad \text{(Equation 6)}$$

$$= \frac{1}{\sigma a^2 + \sigma b^2}(\sigma b^2 SOCa + \sigma a^2 SOCb)$$

wherein SOC is the remaining amount of the calculation result, and Wa and Wb are weighting coefficients. Moreover, the remaining amount error is calculated from Equation 7.

$$\sigma = \sqrt{(Wa \times \sigma a)^2 + (Wb \times \sigma b)^2} \quad \text{(Equation 7)}$$

$$= \sqrt{\frac{\sigma a^2 \sigma b^2}{\sigma a^2 + \sigma b^2}}$$

wherein σ represents an error or the remaining amount of the calculation result.

Next, integration current coming/going into/out of the battery from the time of calculation of the previous remaining amount is successively acquired (212) to perform the correction of the remaining amount change (214). It should be noted that when the stop time is below the threshold value ($t_{stop}$) in step 206, integration current acquisition (212) is immediately started.

The remaining amount change correction (214) adds the integration current to the remaining amount SOC calculated previously according to Equation 8 and corrects the change for output.

$$SOCb = SOC + \int Idt \quad \text{(Equation 8)}$$

wherein SOCb is a remaining amount after the correction (corrected value) by the integration current and ∫Idt is an integration current measurement result during the calculation cycle. Moreover, the random error of the current integration detection is known as a design value of the measurement system and the error generated at each calculation cycle is added to the remaining amount error according to Equation 9 for output.

$$\sigma b = \sigma + \sigma_{fI} \quad \text{(Equation 9)}$$

wherein σ is the error of the final calculation result of the previous time and $\sigma_{SI}$ is a random error of the current integration detection at the calculation cycle. This remaining amount change correction (214) is the remaining amount calculation method 2 of the present embodiment.

Next, it is determined whether the MG is in the power running state (215) as has been described above. If the MG is in the power running state, control is passed to the integration current measurement. Otherwise, control is passed to the processing 216. Moreover, when an instruction of power running is received during processing of frequency generation by the MG control, the frequency generation is immediately stopped and the power running is started.

Next, the impedance measurement interval is determined to be equal to or above the second threshold value $t_{intval}$ (216). If the interval is equal to or above the second threshold value, the MG control is performed so as to generate 4-point frequency (220). The $t_{intval}$ defining this measurement interval is, for example, several minutes. Details will be given later.

On the other hand, when the impedance measurement interval is below the second threshold value, current is monitored. When the operation of $AC_{load}$ (for example, direction indicator) is detected (218), the MG control is performed to the motor controller CPU 72 so as generate 3-point frequency (222). Otherwise, control is returned to the integration current measurement (212). It should be noted that in the case of the $AC_{load}$ detection also, impedance measurement is performed at total of four points including the operation frequency of the load and the frequency of the specified three points.

The method of the MG control is as has been described above and the frequency generated is based on the explanation of FIG. 3. Here, the 4-point impedance measurement should be completed while the battery remaining amount change is sufficiently small. For this, the operation detection of the $AC_{load}$ and the frequency generation by the MG control are performed while the battery remaining amount change is sufficiently small. Considering the other remaining amount detection error factors, it is preferable that it be performed within the time while the remaining amount change of ⅕ or below of the target remaining amount detection accuracy is caused. That is, the upper limit of the 4-point measurement time in the steps 220 and 224 or steps 218–222–224 is the third threshold value $T_{r\_measure}$. For example, when the 1C current is applied and the target remaining amount detection accuracy is 5%, voltage detection by generation of all the frequencies should be completed within 36 seconds from the $AC_{load}$ detection. Here, the $AC_{load}$ operation detection may be performed by detecting that the switch has been moved by the driver.

The battery AC voltage and AC current are measured while current of a specific frequency is applied by the $AC_{Load}$ and the MG control (224). The AC voltage and the AC current detected are subjected to the Fourier transform to calculate the impedance of the specific frequency (226). By this processing, it is possible to obtain the measurement plot shown in FIG. 3.

Moreover, as has been described above, by the battery characteristics explained with reference to FIG. 4 to FIG. 7, the frequency characteristic of the resistance varies according to the DC current component. In the case of the lead battery, the chemical reaction differs between the charge side and the discharge side and the characteristic of r slightly differs. In this embodiment, since attention is paid on the r of the discharge side, after the operation of the $AC_{Load}$ is detected, discharge by the switching element 71 is controlled by the MG control unit 101 so as to control the DC component of the battery current to be in the vicinity of a constant value of the discharge side. More specifically, the DC component is controlled to be in the range of 0.2 C to 0.4 C. In the battery of 20 Ah, 0.2 C corresponds to 4A.

By the processing up to here, the four points of the measurement results shown in FIG. 3 are obtained. These measurement results are analyzed to obtain r and the frequency f at the maximum value of the imaginary axis of the impedance circle. Cdl is calculated by using r and f as Cdl=½ πfr. Conventionally, very weak current of several Hz has been generated by a battery tester for measurement and a state measurement cannot be performed when another load operates. Moreover, it has been necessary to correct the r and Cdl dependency on the DC current component by the DC current component generated by the other load. However, since there is no case that the battery tester is used during operation of a vehicle, no countermeasure has been considered for this problem.

Moreover, it is possible to generate all the frequencies necessary for the MG control at a constant interval for impedance measurement. In the case of the secondary battery not mounted on a vehicle, it is possible to apply current including arbitrary frequency by controlling the other load and charger.

According to the present embodiment, it is possible to perform the characteristic diagnosis of the secondary battery mounted on a vehicle which has been impossible conventionally, without using another tester or power source, at start state, stop state, and during running.

Next, detailed explanation will be given on an error calculation specific to the present invention. The current and the voltage detection results contain an almost constant random error. This is known as a design value of the detection system. The affect of this random error is calculated by the error propagation rule to calculate the errors contained in the Cdl and r. The difference between the maximum value and the minimum value of the impedance calculated from the current and the voltage measurement result range is averaged by the measurement results at the respective points of FIG. 3 to obtain the r error. Moreover, when calculating the center of the circle, it is possible to calculate the standard deviation from the distribution of the intersecting points of the perpendicular bisectors in FIG. 3, so that it is reflected in the error.

Here, the voltage change caused by the current applied to the battery and the battery impedance are normally very small for the battery voltage because of the $AC_{Load}$ and the generation control. In order to obtain this voltage change with a high accuracy, in this embodiment, the DC component is removed by the AC voltage detection 32 and the AC current detection 34, so as to increase the amplification ratio for detection of the voltage change, which is acquired by the CPU. Moreover, a low pass filter is provided for removing noise of 5 kHz and above caused by the rectifying ripple current of the generator.

The large current upon engine start and the large voltage change at that moment cannot be acquired by the AC detection system because they exceed the measurement range. In this case, detection is performed by the DC voltage detection 33 and the DC current detection 35 and the battery impedance is calculated. Thus, by preparing two detection systems, it becomes possible to measure impedance with a high accuracy. It is also possible to use a voltage and a current detector in which amplification ratio can be switched.

Next, in the remaining amount calculation (228), r and the error σr contained in the r are received from the impedance calculation (226) and the remaining amount is calculated according to Equation 10. The remaining amount calculation (228) based on this impedance calculation result is the remaining amount calculation method 3 in this embodiment.

$$SOCa = SOCtable\_r(r) \qquad \text{(Equation 10)}$$

wherein $SOC_{table\_r}$ is a function to calculate the remaining amount SOC from the relationship between the r and the remaining amount shown in FIG. 4. Moreover, the remaining amount error σa is calculated from Equation 11 and is output.

$$\sigma a = SOCtable\_r(r-\sigma_r) - SOCtable\_r(r+\sigma_r) \qquad \text{(Equation 11)}$$

wherein σa is an error of the remaining amount and σr is an error of the r. Moreover, it is also possible to correct the r from the relationship between the r and the temperature shown in FIG. 5.

In the processing of the weighted averaging of the remaining amount (230), the remaining amount and the error are received from the remaining amount calculation (228) and the remaining amount change correction (214) and the remaining amount is weighted-averaged according to Equation 12 (230).

$$SOC = Wa \times SOCa + Wb \times SOCb \qquad \text{(Equation 12)}$$
$$= \frac{1}{\sigma a^2 + \sigma b^2}(\sigma b^2 SOCa + \sigma a^2 SOCb)$$

wherein SOC is a remaining amount of the calculation result of the weighted averaging, SOCa and σa are remaining amount and its error received from remaining amount calculation using the impedance and SOCb and σb are remaining amount and its error received from remaining amount change correction (214). Wa and Wb are weighting coefficients. Moreover, the error σ is calculated by Equation 13.

$$\sigma = \sqrt{(Wa \times \sigma a)^2 + (Wb \times \sigma b)^2} \qquad \text{(Equation 13)}$$
$$= \sqrt{\frac{\sigma a^2 \sigma b^2}{\sigma a^2 + \sigma b^2}}$$

wherein σ is an error of the remaining amount of the calculation result.

Moreover, the remaining amount calculation operates only when the impedance calculation operates, i.e., only when the $AC_{Load}$ and the generator control operate. During the other calculation periods, the remaining amount is calculated only by the remaining amount change correction based on the integration current.

By this weighted averaging (230), the result of the remaining amount calculation by the impedance calculation is accumulated in the form of average value and it is possible to reduce the affect of the random error. In the case of the ordinary digital filter processing, as the filter becomes stronger, the effect to remove the random noise increases and the response delay increases. However, in the remaining amount calculation including the weighted averaging in this embodiment, the remaining amount change is successively corrected and the time delay hardly occurs. Thus, according to this embodiment, it is possible to provide a high-accurate remaining amount calculation result almost without response delay.

Figure 15:
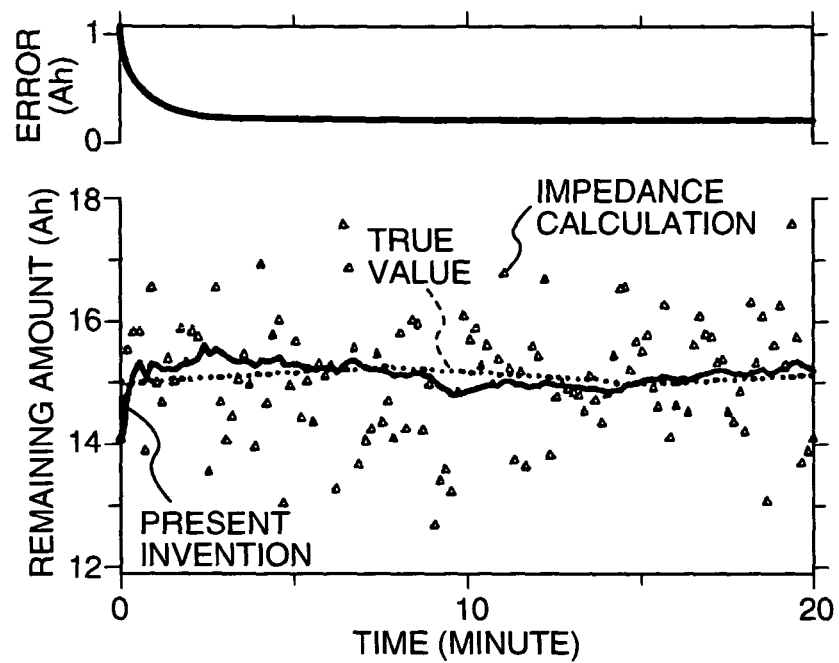
FIG. 15 shows calculation results of the battery remaining amount and its error.
Figure 16:
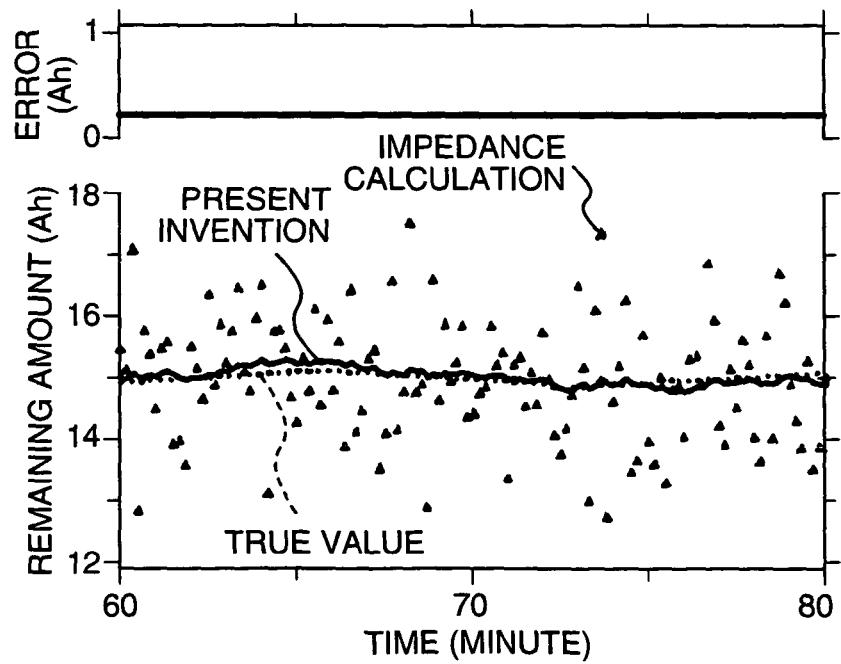
FIG. 16 is a continuation of FIG. 15 and shows calculation results of the remaining amount and its error.

FIG. 15 and FIG. 16 show remaining amount calculation results when impedance calculation is performed by applying a current including arbitrary frequency to the battery every 10 seconds. The vertical axis represents the error (Ah) and the remaining amount (Ah) and the horizontal axis represents the time (minute). The lower half of the graph shows the plot of the remaining amount, showing the remaining amount calculation result (black triangle) based on the impedance calculation result. The solid line shows the remaining amount calculation result by the weighted averaging. The dotted line shows the remaining amount measurement result before and after the experiment and the remaining amount measurement result (true value) calculated according to the charge amount measured by the current integrator. The upper half of the graph shows the remaining amount error.

In the remaining amount calculation result according to the present invention, the error defined by the standard deviation as the time elapses is subtracted from the calculation result of 0 to 20 minutes shown in FIG. 15, thereby approaching the true value. Moreover, when the error is reduced from the calculation result of 60 to 80 minutes shown in FIG. 16 as the time elapses, the error is converted to a constant value and the remaining value near to the true value is continuously output.

In FIG. 15, the initial value of the remaining amount is shifted for starting experiment so that the effect of the calculation method of the present embodiment can easily be seen. In the actual operation, the remaining amount upon the previous operation end is maintained so as to maintain a remaining amount calculation if a high accuracy.

Here, a value for converging the error is calculated assuming 1 Ah for the error of the remaining amount calculation and 3A for the error of the current integration. In Equation 13, σa is 1 Ah. σb is increased for 10 seconds from σ of the preceding cycle of the remaining amount calculation according to Equation 9 by $\sigma_{Sf}(3 \text{ (A)} \times 10/3600 \text{ (h)})$. Since the error change is converged here, the σ 10 seconds before (the first term in the right side of Equation 9) is equal to the σ of the current calculation result (left side of Equation 13). Equation 9 becomes σb=σ+3 (A)×(10/3600) (h). The aforementioned value is substituted in Equation 13, and 1 Ah is substituted in σa. Then, if solved for σ, the error is converted to about 0.25 Ah.

Thus, the error convergence value depends on the remaining amount calculation error, the current integration error, and the remaining amount calculation cycle. When the remaining amount calculation error achieves the target, there is no need of applying the error calculation of the present invention. However, in the battery of high performance, changes of the output voltage and the internal resistance caused by the charge state change are small and the remaining amount calculation error often does not achieve the target. In such a case, the error calculation method of the present invention can exhibit its effect. For example, it is possible to perform a remaining amount calculation whose error is converged to ½ or below of the remaining amount calculation error.

When a given measurement instrument cannot improve its accuracy, by appropriately setting the cycle $t_{intval}$ for forcibly performing the remaining amount calculation according to the current integration error while changing the remaining amount calculation cycle, it is possible to perform the remaining amount calculation whose error is converged to ½ or below of the remaining amount calculation error.

Next, explanation will be given on the service life calculation. Here, the service life means the size of the remaining amount region usable. If a battery is cup, the remaining amount is the amount of water in the cup, and the whole volume is the volume of the cup. The service life is the ratio of the current volume against the initial volume.

The service life calculation uses the remaining amount calculated in the remaining amount weighted-averaging (230) and the Cdl calculated in the impedance calculation (226) and calculates the service life according to Equation 14 (232).

$$SOHa = SOH\text{table}(C_{dl}) \qquad \text{(Equation 14)}$$

wherein SOHtable is a function to calculate the service life by referencing FIG. 6. Here, it is possible to perform temperature correction by referencing the temperature T detected by the temperature detection 30 and the relationship between the temperature and Cdl. This service life calculation (232) is the service life calculation method 1 in the present embodiment.

In this embodiment, since weighted averaging (230) is performed when calculating the remaining amount, it is possible to perform a highly-reliable service life calculation based on the accurate remaining amount. Of course, it is also possible to combine use this service life calculation in combination with other remaining amount calculation method.

Moreover, in the service life calculation (232), in the same way as the remaining amount calculation, an error contained in the service life calculation result is calculated according to the error of Cdl by using Equation 15 and is output.

$$\sigma a = SOH\text{table}(C_{dl} - \sigma_{Cdl}) - SOH\text{table}(C_{dl} + \sigma_{Cdl}) \qquad \text{(Equation 15)}$$

wherein σa is a service life error and σcdl is an error of Cdl.

Next, in the service life correction (234), the service life change amount is calculated using the previous service life calculation result based on the temperature T and the elapse time t according to Equation 16 and correction is performed.

$$SOHb = SOH - \eta t \log_{10}(T-25)$$ (Equation 16)

wherein η is a service life reduction ratio per unit time at 25 degrees C. This service life correction (234) is the service life calculation method 2 in this embodiment.

In general, the battery service life has twice deterioration advance by temperature increase of 10 degrees C. The service life reduction as the time elapse is calculated from the difference between the battery nominal value and the nominal value measurement temperature. Moreover, as the cycle service life, the deterioration advance speed for the charge/discharge amount is known as a nominal value. The service life correction to calculate the service life reduction by multiplying the deterioration advance speed by the integration current value is known. Moreover, the service life reduction accompanying the time elapse and charge/discharge differs depending on the individuals. The difference between the service life reductions of the individuals is measured using the same type of batteries and a standard deviation is set in advance to correct the service life error.

Moreover, the error increase by the service life correction is calculated by Equation 17.

$$\sigma b = \sigma + \xi t$$ (Equation 17)

wherein ξ is an individual difference of the service life reduction ratio.

Next, in the same way as the remaining amount, the weighted averaging (236) of the service life is performed by using Equation 18.

$$SOH = Wa \times SOHa + Wb \times SOHb$$ (Equation 18)
$$= \frac{1}{\sigma a^2 + \sigma b^2}(\sigma b^2 SOHa + \sigma a^2 SOHb)$$

wherein SOH is a service life of the calculation result, SOHa and σa are the service life received from the service life calculation and its error, and the SOHb and σb are service life received from the service life correction and its error. Wa and Wb are weighting coefficients. Moreover, the error is calculated from Equation 19.

$$\sigma = \sqrt{(Wa \times \sigma a)^2 + (Wb \times \sigma b)^2}$$ (Equation 19)
$$= \sqrt{\frac{\sigma a^2 \sigma b^2}{\sigma a^2 + \sigma b^2}}$$

As has been described above, by performing weighted averaging to the service life calculation, it is possible to accumulate a plurality of calculation results, thereby further increasing the reliability.

Moreover, in controlling a set of batteries, there are self-discharge speed irregularities between each battery and it is necessary to periodically make even the charge amount.

In this embodiment, uniform charge is performed to charge all the batteries to full charge periodically. The uniform charge is a charge method using aqueous solution as electrolyte in which charge is performed to define the relationship between the voltage and current and the charge is terminated when a predetermined time has elapsed after the current is lowered below a predetermined value. The definition of the relationship between the voltage and the current may be CC-CV charge, taper charge, 2-state step, and the like. In this embodiment the CC-CV charge is used. However, there is no problem if other charge methods are used. Here, deterioration due to inactivity of the active material is also detected simultaneously. Accordingly, in FIG. 4, it is detected how much the remaining amount is increased and can be used. For example, a cup is filled with water and by measuring the water amount (remaining amount), the cup volume (service life) is measured.

According to this embodiment, the remaining amount can be detected with a high accuracy after charging to full charge and accordingly, it is possible to accurately detect the service life determined by the inactivity of the battery. The service life calculation after the charging to the full charge is the service life calculation method 3 of the present embodiment.

Figure 17:
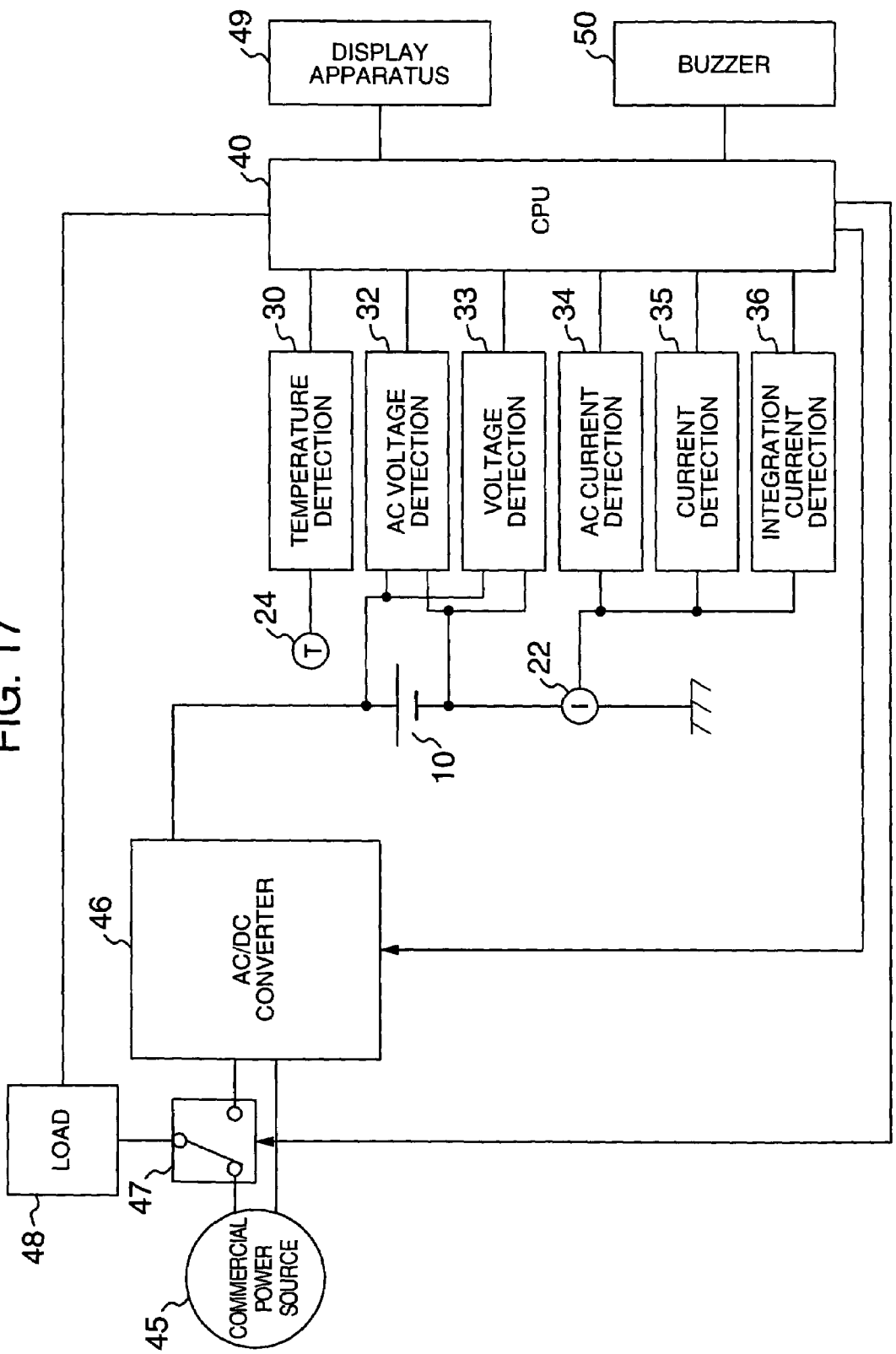
FIG. 17 shows configuration of a no-break power unit as another application example of the present invention.

FIG. 17 shows an example of the present invention applied to a no-break power unit. Explanation will be given only on the points which are different from the configuration of FIG. 10. An AC-DC converter 46 is provided for converting AC power into DC power and DC power into AC power. A commercial power source 45, a switching unit 47, and a load 48 are connected as shown in the figure. Here, the load 48 is a domestic electric device such as an air conditioner, a refrigerator, a microwave oven, and an illumination or other electric devices such as a motor, elevator, computer, and medical device. 49 is a display apparatus and 50 is a buzzer. These devices may have a switching unit inside.

The CPU 40 controls the AC-DC converter 46 so as to apply AC current of arbitrary frequency to the battery 10 and calculates the remaining amount and the service life of the battery 10. As shown in the Figure, when the commercial power source 45 supplies power, the battery 10 is charged to full charge via the AC-DC converter 46. When the supply from the power source 45 stops, the switching unit 47 is switched and the AC-DC convert 46 is controlled so that power is supplied from the battery 10 to the load 48. Moreover, when the remaining amount is reduced below a predetermined value while power is supplied from the battery 10, a stop request is transmitted to the load 48. The display apparatus 49 displays the remaining amount and the service life of the battery 10. When the service life is reduced below a threshold value, a buzzer 50 is operated to notify a user. Furthermore, the CPU 40 may be connected to a server via a communication apparatus so that when the service life of the battery 10 has reached a limit, replacement can be requested.

According to the present embodiment, the service life of the battery can be calculated accurately and accordingly, it is possible to sufficiently drive the load even upon service interruption and provide a system having a high reliability. Moreover, the battery characteristic can be monitored at a remote place and accordingly, it is possible to properly manage a battery of an unmanned apparatus.

FIG. 18 is an example of the present invention applied to a vehicle using a fuel battery. Explanation will be given only on the point different from the configuration of FIG. 9. As an apparatus for extracting energy from fuel, the engine is replaced by FC (fuel cell) 300. The FC 300 is connected to the battery 10, the inverter 61, ACLoad 42, and DCLoad 41. Moreover, the FC 300 is connected to and controlled by an FC controller (FCC) 310. The FCC 310 communicates with the total controller 92 via a network and receives a fuel cell generation amount instruction.

FIG. 19 shows control modes of a fuel cell vehicle and energy flow.

(1) When the battery has sufficient remaining amount at the start, for collecting the next speed reduction energy from the battery, the battery remaining amount should be reduced. The FC does not generate electricity and energy flows from the battery via the MG to the tires for starting the vehicle. Here, the MG is in the power running state and it is impossible to generate a signal for the battery state detection.

(2) When the battery has small remaining amount at the start, energy flows from the FC via the MG to the tires for starting the vehicle. Here, the MG is in the power running state and it is impossible to generate a signal for the battery state detection.

(3) During the acceleration assist, the FC generates electricity and energy flows from the FC and the battery via the MG to the tires for accelerating the vehicle. Here, the MG is in the power running and it is impossible to generate a signal for the battery state detection.

(4) During the acceleration/running, the FC generates electricity and energy flows mainly from the FC via the MG to the tires for accelerating/running the vehicle. Here, the MG is in the power running and it is impossible to generate a signal for the battery state detection.

(5) During the speed reduction, the FC does not generate electricity and energy flows from the tires via the MG to the battery and the vehicle speed is reduced. Here, thee MG is rotating. When the speed reduction is performed in cooperation with the brake, it is possible to generate a signal for the battery state detection.

(6) If the battery remaining amount is sufficiently large when the vehicle stops, in order to sufficiently collect next speed reduction energy to the battery, the battery remaining amount should be reduced. The FC does not generate electricity and energy flows from the battery to the Load. Here, the MG is in the stop state and it is possible to generate a signal for the battery state detection.

(7) If the battery remaining amount is small when the vehicle stops, the FC generates electricity and energy flows from the FC and the battery to the Load. Here, the MG is in the stop state and it is possible to generate a signal for the battery state detection.

Thus, the hybrid vehicle and the fuel cell vehicle have different power train configurations. Accordingly, the MG control for the vehicle running modes greatly differs and the number of timings capable of generating a signal for the battery state detection is reduced. That is, the signal can be generated only during speed reduction and vehicle stop state.

During the vehicle stop state, speed reduction, or vehicle start after the stop, the state detection signal is generated and the battery state can be known, causing no problem. However, when acceleration and running control mode continues for a long time, the integration error of the current integration is accumulated to lower the accuracy of the battery remaining amount and there arises a problem that sufficient energy cannot be supplied at the next vehicle start.

However, in this invention, as has been described above, the error of the remaining amount is always detected. When the acceleration and running mode continues for a long time and the remaining amount error is increased, control is passed to the uniform charge mode to charge the battery while maintaining the battery average voltage constant. When acceleration and running mode continues, it is impossible to generate the state detection signal. During this time, it is possible to perform maintenance of the battery to prolong the battery service life. It should be noted that when the remaining amount error cannot be obtained, it is possible to pass control to the uniform charge mode when the acceleration and running mode has continued for a predetermined period of time.

According to the present invention, it is possible to accurately diagnose the remaining amount (accumulation amount) and the service life (deterioration) of the battery. Moreover, according to the present invention, weighted mean of the remaining amount and its corrected value or the service life and its corrected value is accumulated. Accordingly, it is possible to reduce the affect of the random error accompanying the time elapse.

Moreover, it is possible to automatically measure the characteristic of the battery mounted on a hybrid vehicle including the running mode without using another power source. Thus, it is possible to accurately detect the battery remaining amount and the service life, thereby eliminating the trouble that the engine cannot be operated at start or power up cannot be performed during running. Thus, it is possible to perform a highly reliable management. It should be noted that it is possible to measure the battery characteristics during speed reduction or vehicle stop in the case of a fuel cell vehicle.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method for evaluating characteristic of a secondary battery passing power to/from one or more electric devices mounted on a vehicle, the method comprising steps of:
measuring the current and voltage of the secondary battery according to a plurality of frequencies generated by the one or more electric devices;
calculating impedance of the secondary battery from the measurement results; and
evaluating the battery characteristic of the secondary battery from the impedance calculated;
wherein the electric device is a motor/generator for driving the vehicle and generating electricity by receiving drive force from the vehicle, and the method further comprises steps of:
controlling the motor/generator during a non-power running period of the motor/generator;
measuring the current and voltage of the secondary battery while changing the frequency of the state detection current applied to the secondary battery;
calculating the impedance from the measurement results;
calculating the remaining amount of the secondary battery from the impedance and the battery characteristics;
calculating a parasitic capacity of the secondary battery from the remaining amount and the impedance;
performing deterioration calculation to obtain a service life;
calculating a correction value of the change of the remaining amount or the service life according to the integration current of the secondary battery successively measured during the impedance calculation;
maintaining an error of the calculation result of remaining amount or the service life up to the preceding time;
calculating an error of the calculation result this time after correcting the change from the preceding calculation result; and calculating a weighted mean according to the preceding error and the current error.

2. A secondary battery evaluation method as claimed in claim 1, wherein the battery consists of a plurality of sets of batteries and uniform charge is performed periodically for charging all the cells to the full charge, after which the remaining amount of the battery is calculated.

3. A method for evaluating characteristic of a secondary battery passing power to/from one or more electric devices mounted on a vehicle, the method comprising steps of:
measuring the current and voltage of the secondary battery according to a plurality of frequencies generated by the one or more electric devices;
calculating impedance of the secondary battery from the measurement results; and
evaluating the battery characteristic of the secondary battery from the impedance calculated;
wherein the electric device is a generator driven by an internal combustion engine of the vehicle and measure current and voltage of the secondary battery while controlling the output of the generator and changing the frequency of the state detection current applied to the secondary battery, the method further comprising steps of:
calculating an impedance from the plurality of measurement results;
calculating the remaining amount of the secondary battery from the impedance and the battery characteristic;
calculating a parasitic capacity of the secondary battery from the remaining amount and the impedance;
performing deterioration calculation according to the parasitic capacity of the secondary battery to obtain a service life;
calculating a correction value of the change of the remaining amount or the service life according to the integration current of the secondary battery successively measured during the impedance calculation;
maintaining an error of the calculation result of remaining amount or the service life up to the preceding time;
calculating an error caused by the current calculation result in which the change from the preceding calculation result is corrected; and
obtaining a weighted mean of the error of the preceding error and the current error.

4. A secondary battery evaluation method as claimed in claim 3, wherein the battery consists of a plurality of sets of batteries and uniform charge is performed periodically to charge all the cells to full charge, after which the remaining amount of the battery is calculated.

5. A secondary battery evaluation method for evaluating a secondary battery by calculating the impedance according to measurement results of current and voltage of the secondary battery and referencing the battery characteristic, the method comprising steps of:
calculating the impedance while successively changing the frequency of the current flowing to the secondary battery;
calculating the remaining amount of the secondary battery from the impedance and the battery characteristic;
calculating a correction value of the remaining amount change according to an integration current of the secondary battery successively measured during impedance calculation; and
calculating the remaining amount of the secondary battery by averaging the remaining amount and the correction value.

6. A secondary battery evaluation method as claimed in claim 5, the method comprising steps of:
performing deterioration calculation according to the parasitic capacity of the secondary battery obtained from the remaining amount and the impedance, so as to obtain a service life;
calculating a second correction value by correction of the service life change based on the integration current; and
averaging the service life and the second correction value, so as to obtain the service life of the secondary battery.

7. A secondary battery evaluation method as claimed in claim 6, the method comprising steps of:
maintaining an error by the calculation result of the remaining amount or the service life up to the preceding time;
calculating an error of the calculation result this time after correcting the change from the preceding calculation result; and
obtaining a weighted mean of the preceding error and the current error.

8. A secondary battery evaluation method as claimed in claim 5, wherein the interval ($t_{intval}$) for calculating the remaining amount is optimized according to the error of the integration current.

9. A secondary battery evaluation method as claimed in claim 6, wherein the deterioration calculation is corrected according to the parasitic capacity of the secondary battery and temperature characteristic.

10. A secondary battery evaluation method as claimed in claim 5, wherein the impedance calculation is performed by selecting three or more points from a frequency range 1 to 1000 Hz and measuring the current and voltage of the secondary battery according to the operation of the AC current load indicating one of the frequency points, after which the current and voltage of the other points are measured.

11. A secondary battery evaluation method as claimed in claim 6, wherein the calculation of the remaining amount or the service life employs both of the calculation method based on the impedance and the calculation method based on the integration current detection performed successively during the impedance calculation and the calculation results of the calculation methods are subjected to weighted mean.

12. A battery apparatus for evaluating battery characteristic of a secondary battery passing power to/from one or more electric devices mounted on a vehicle, comprising:
control means for applying the state detection current by a plurality of frequencies generated by operation of the one or more electric devices to the secondary battery;
impedance calculation means for measuring current and voltage of the secondary battery based on the frequency and calculating the impedance of the secondary battery from the measurement results;
storage means containing characteristic relationship between the remaining amount and the impedance of the secondary battery; and
battery characteristic calculation means for evaluating the battery characteristic of the secondary battery for the impedance calculated according to the characteristic relationship;
wherein the electric device is a motor/generator for driving the vehicle and generating electricity by receiving the drive force from the vehicle or a generator driven by an internal combustion engine as a passive source of the vehicle and the control means detects a non-power running period of the motor/generator, stops output of the motor/generator or the generator, and changes the frequency of the state detection current applied to the secondary battery.

13. A battery apparatus comprising:

a voltage/current detection unit for detecting voltage and current of a secondary battery;

a storage unit for storing battery characteristics of the secondary battery calculated in advance so as to be referenced; and a CPU having an impedance calculation unit for calculating the impedance of the secondary battery from the detected voltage and current, a remaining amount calculation unit for calculating the remaining amount of the secondary battery according to the calculated impedance and the battery characteristics, a remaining amount change correction unit for correcting the remaining amount change according to an integration current of the secondary battery, a service life calculation unit for calculating the service life of the secondary battery according to the parasitic capacity calculated by the impedance calculation unit and the remaining amount calculated by the remaining amount calculation unit, and a service life change correction unit for correcting the service life change;

wherein the calculation results of the remaining amount calculation unit and the remaining amount change correction unit and/or the service life calculation unit and the service life change correction unit are subjected to weighted mean to obtain the remaining amount and/or the service life of the secondary battery.

14. A battery apparatus as claimed in claim 13, wherein control is made to apply a state detection current of frequency range of 1 to 1000 Hz to the secondary battery and the impedance is calculated at three or more points in the frequency range.

15. A battery apparatus as claimed in claim 13, wherein the voltage/current detection unit includes two systems, i.e., AC detection means and DC detection means.

* * * * *